United States Patent [19]
Tronc et al.
[11] 4,201,920
[45] May 6, 1980

[54] APPARATUS FOR IRRADIATING A TARGET ON TWO OPPOSITE FACES BY MEANS OF AN ACCELERATED CHARGED PARTICLE BEAM

[75] Inventors: Dominique Tronc; Claude Levaillant, both of Buc, France

[73] Assignee: C.G.R. MeV, Buc, France

[21] Appl. No.: 919,551

[22] Filed: Jun. 27, 1978

[30] Foreign Application Priority Data

Jul. 1, 1977 [FR] France .............................. 77 20376

[51] Int. Cl.[2] .............................................. H01J 37/00
[52] U.S. Cl. ......................... 250/492 B; 250/396 ML
[58] Field of Search ........... 250/492 B, 492 R, 396 R, 250/396 ML, 398; 313/361, 442; 219/121 EB, 121 EM

[56] References Cited

U.S. PATENT DOCUMENTS

| | | | |
|---|---|---|---|
| 2,897,365 | 7/1959 | Dewey et al. | 250/492 B |
| 2,931,903 | 4/1960 | Van De Graaf et al. | 250/492 B |
| 3,629,578 | 12/1971 | Le Poole | 250/398 |
| 3,942,017 | 3/1976 | Uehara et al. | 250/492 B |
| 4,075,496 | 2/1978 | Uehara | 250/492 B |

*Primary Examiner*—Bruce C. Anderson
*Attorney, Agent, or Firm*—Cushman, Darby & Cushman

[57] ABSTRACT

Apparatus for irradiating the two opposite faces of a target by means of a scanning beam and comprising a magnetic deflection system formed by an electromagnet provided with two pole pieces disposed downstream of the target to be irradiated, the length of the pole pieces corresponding to the amplitude of the scanning beam in such a way that, if $\theta=\theta_1+\theta_2$ is the total scanning angle, the scanning beam of angle $\theta_1$ impinges on one face of the target, while the scanning beam of angle $\theta_2=\theta-\theta_1$ is deflected in the magnetic deflection system and irradiates the other face, the polepieces having a face, so-called useful face, facing the other face of the target and comprising several sections with different curvatures for obtaining a reflected beam substantially perpendicular to this other face of the target.

11 Claims, 11 Drawing Figures

APPARATUS FOR IRRADIATING A TARGET ON TWO OPPOSITE FACES BY MEANS OF AN ACCELERATED CHARGED PARTICLE BEAM

FIELD OF THE INVENTION

In certain applications, it can be of advantage to be able simultaneously to irradiate a target of predetermined shape on two of its opposite faces, as may be the case where it is necessary to irradiate a fluid circulating through a parallelepipedic or cylindrical pipe, by means of an accelerated charged particle beam. In fact, if the energy of the charged particles is limited to 10 Mev for example in order to avoid any risk of induced radioactivity and if these particles are electrons, the thickness of the fluid treated by irradiation of the target on one face only can amount to approximately 4 cm. The simultaneous irradiation of the two opposite faces of the pipe enables this thickness to be increased to approximately 8 cm.

The irradiation apparatus according to the invention enables the two opposite faces of a target to be simultaneously irradiated.

SUMMARY OF THE INVENTION

It is an object of the invention to provide an irradiation apparatus for irradiating by means a charged particle beam at least two opposite faces of a target, this apparatus comprising a charged particle accelerator, a microwave generator supplying a microwave signal, means for injecting this microwave signal into the accelerating structure of the accelerator, means for obtaining a scanning beam of angle $\theta$ from the beam F of accelerated particles, the scanning beam moving withing a vacuum-tight scanning chamber, said target being disposed over part of the path of the scanning beam corresponding to a scanning angle $\theta_1$ in such a way that the scanning beam of angle $\theta_1$ impinges on one face A of the target; a magnetic deflection system equipped with two pole pieces, delimiting an air gap of height h being disposed downstream of said target C, these pole pieces arranged parallel to the scanning plane having a length at least equal to the amplitude of the scanning beam considered at said pole pieces, this amplitude corresponding to the scanning beam of angle $\theta=\theta_1+\theta_2$, said scanning chamber comprising at least an opening for positioning the target on a part of the path of the scanning beam corresponding to the angle $\theta_1$, said opening being provided with at least one vacuum-tight window, the other part of the scanning beam of angle $\theta_2=\theta-\theta_1$, which is not intercepted by the target, entering the air gap of the pole pieces of the magnetic deflection system by a face U, so-called useful face U, of these pole pieces, the other part of the scanning beam being deflected and leaving the pole pieces by this useful face U to impinge on the other face B opposite the face A of the target this useful face comprising several sections with different curvatures for obtaining a reflected beam substantially perpendicular to said opposite face B.

BRIEF DESCRIPTION OF THE DRAWINGS

For a better understanding of the invention and to show how the same may be carried into effect, reference will be made to the drawings, given solely by way of example which accompany the following description, and wherein.

DETAILED DESCRIPTION

Figure 1:
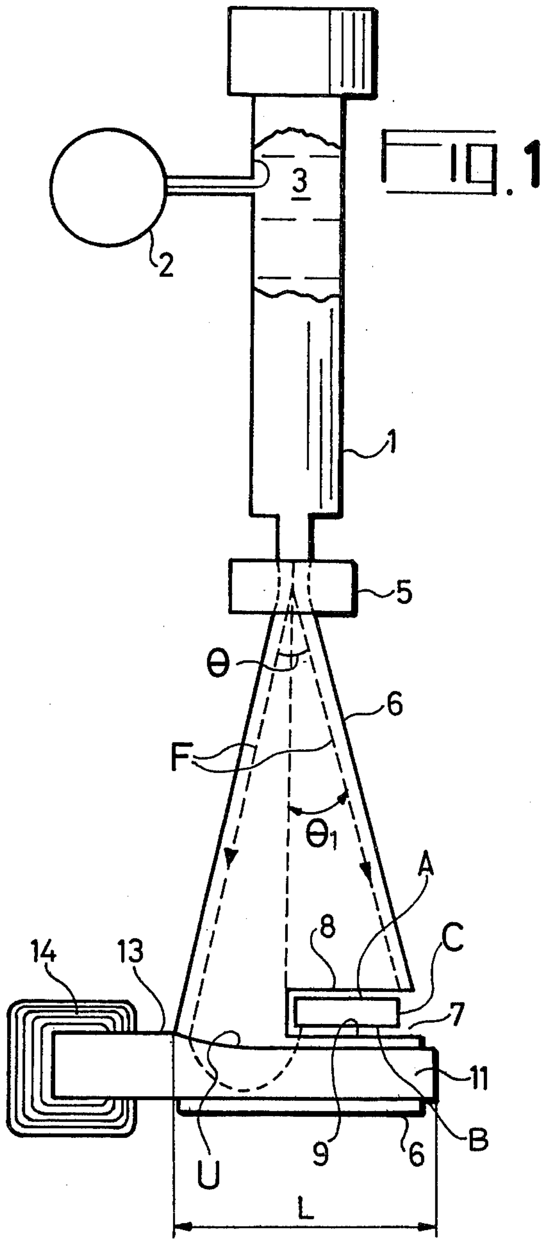
FIG. 1 diagrammatically illustrates one example of embodiment of an irradiation apparatus according to the invention.
Figure 2:
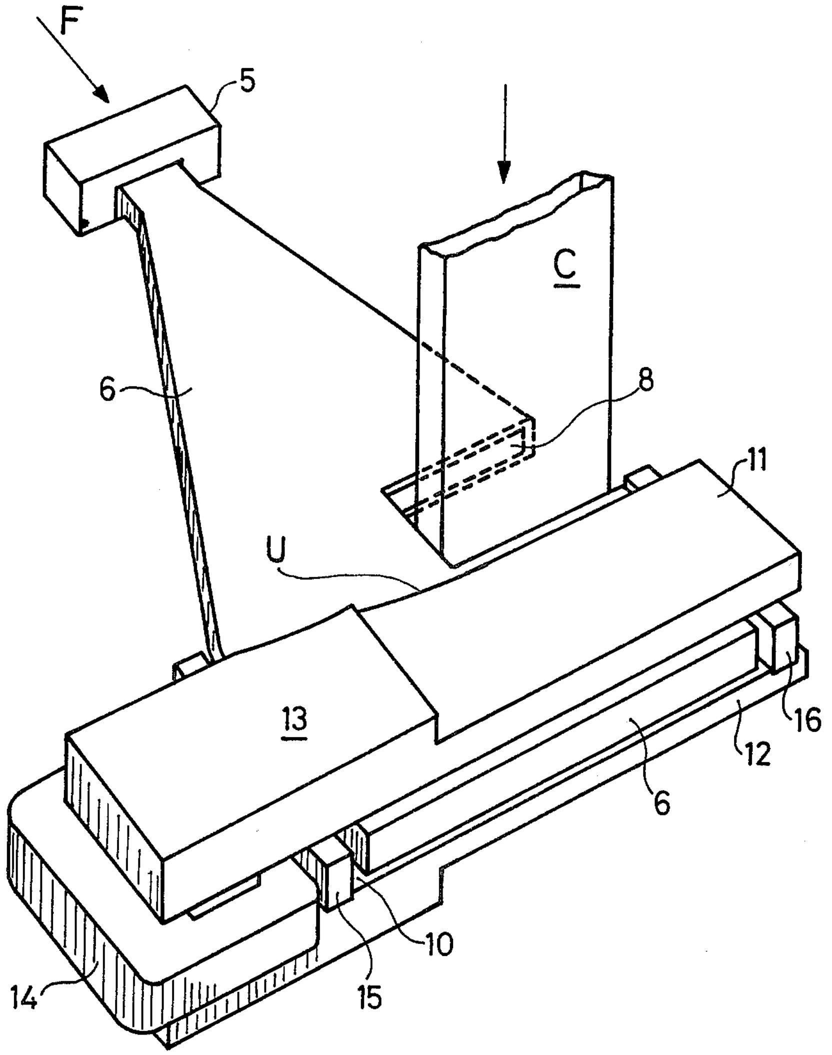
FIG. 2 is a perspective view of part of the apparatus shown in FIG. 1.

In the example of embodiment illustrated in FIG. 1, the irradiation apparatus comprises an accelerator 1, for accelerating charged particles (for example electrons), associated with a microwave generator 2 supplying a microwave signal intended to be injected into the accelerating section 3 of the accelerator 1. In the embodiment shown in FIG. 1, a scanning system 5 for the beam F of charged particles is provided at the output end of the accelerator 1. A vacuum-tight scanning chamber 6 forming a horn is fixed to the end of the accelerator 1. An opening 7 intended to receive a sample or target C to be irradiated and provided with two windows 8 and 9 situated opposite one another, is formed in the wide-part of the scanning chamber 6. The windows 8 and 9 are vacuum-tight and transparent to the electrons. As shown in FIG. 2, this target C may be part of a parallelepipedic pipe of rectangular cross-section.

The part of the scanning chamber 6 which is situated beyond the opening 7 is disposed between the pole pieces 11,12 (FIG. 2) of an electromagnet 13 equipped with a winding 14, the target C to be irradiated being disposed in the opening 7 over part of the scanning beam F. The pole pieces 11 and 12 offer to the beam F a useful face U of such shape that this beam F enters the air gap between the pole pieces 11, 12 substantially perpendicularly of this useful face U and emerges from it substantially perpendicularly, after having been deflected through an angle at least equal to $\pi$. A lead shield 15 protects the winding 14 of the electromagnet 13 from the irradiations and a spacer member 16 maintains a suitable distance between the pole pieces 11 and 12.

Figure 3:
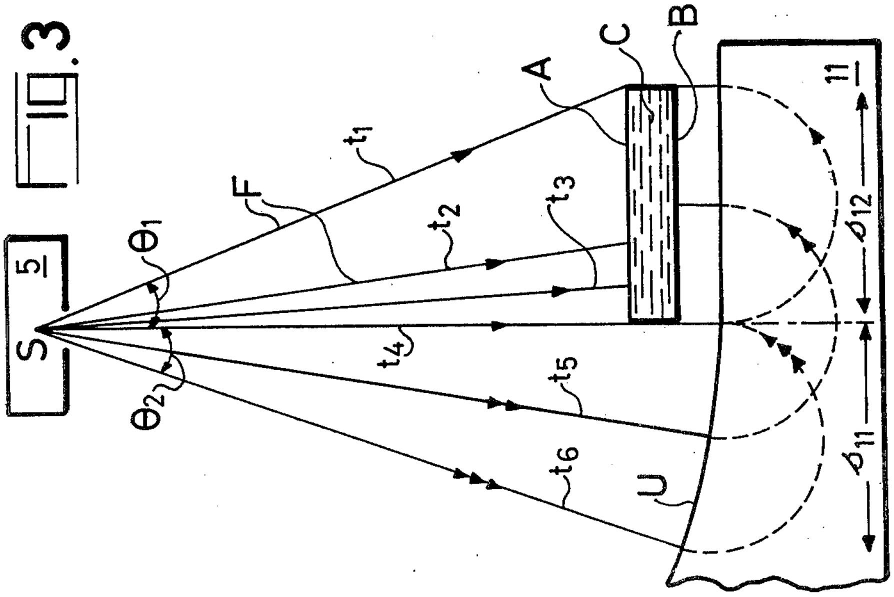
FIG. 3 shows various paths of the scanning beam in the apparatus shown in FIG. 2.

FIG. 3 shows in detailed manner, how the irradiation of the two faces A and B of the target C is obtained. In operation, the paths $T_1$, $t_2$, $t_3$. . . . corresponding to a scanning angle $\theta_1$ impinge on the face A of the target C while the paths $t_4$, $t_5$, $t_6$, deflected by the magnetic field H created between the pole pieces 11, 12 of the electromagnet 13, impinge on the face B of the target C. In the example of embodiment shown in FIG. 3, the useful face U has two sections $s_{11}$, $s_{12}$ differing in their radius of curvature, the first section $s_{11}$ being in the form of an arc of which the centre of curvature coincides with the origin S of the scanning beam F and the second section $s_{12}$ being rectilinear.

Figure 4:
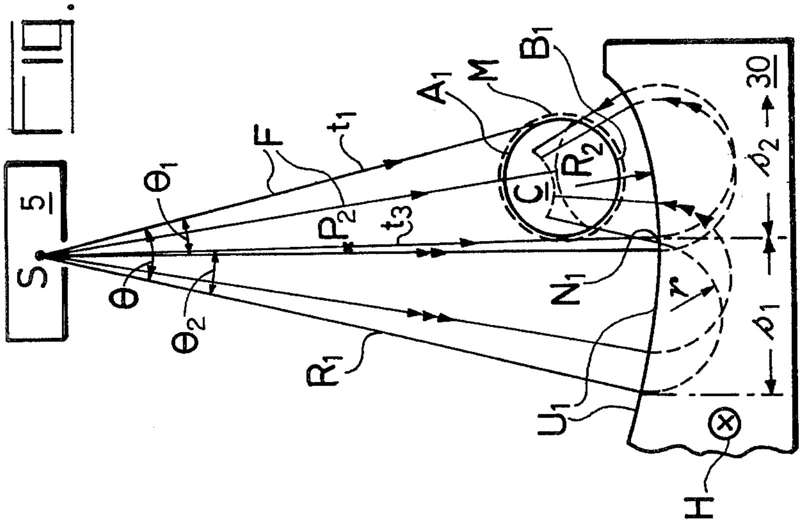
FIGS. 4 to 8 show another examples of embodiment of an irradiation apparatus according to the invention.

In the example of embodiment of the irradiation apparatus shown in FIG. 4, the target C to be irradiated is formed by a portion of a pipe of circular cross-section. The useful face $U_1$ of the pole pieces 30, 31 (only the pole piece 30 is visible in FIG. 4) comprises a first concave section $s_1$ with a radius of curvature $-R_1=k_1r$, $k_1$ being a factor from 2 to 4 and r being the radius of curvature of the particle paths in the airgap of the pole-pieces 30, 31, and a centre of curvature S substantially located at the origin of the scanning beam, and a second section $s_2$ with a radius of curvature $-R_2=k_2R_1$, with $0.4<k_2<0.6$, the centre of curvature $P_2$ of the section $s_2$ being situated on the straight line S $N_1$ which forms a tangent to the target C and which is normal to useful face $U_1$ at the junction $N_1$ of the sections $s_1$ and $s_2$. The window of the scanning chamber is a cylindrical sleeve M of diameter $D=2R_o$, $R_o$ being the radius of curvature of the pipe forming the target C.

In operation, the scanning beam of angle $\theta_1$ irradiates the face $A_1$ limited by the tangential trajectories $t_1$, $t_3$ and the scanning beam of angle $\theta_2$, which is deflected by the magnetic field H created between the pole pieces 30, 31 impinges on the face $B_1$ of the target C.

Figure 5:
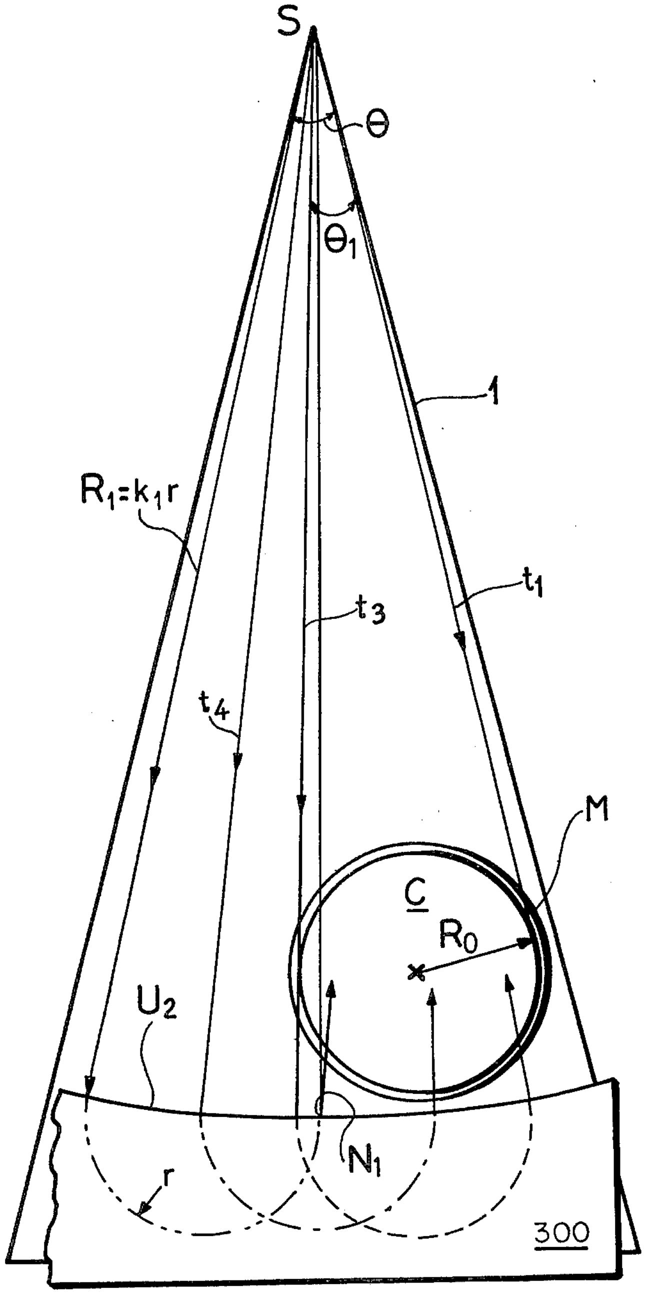

However, in the interests of simplicity, when the scanning angle $\theta$ is sufficiently small, the pole pieces 30, 31 may have a useful surface $U_2$ (FIG. 5) of substantially constant concavity with a radius $R_1=k_1$ r, r being the radius of curvature of the trajectories in the air gap between the pole pieces 300 and 310, and $k_1$ being a factor of from 2 to 4, the centre of curvature being substantially at the origin S of said scanning beam.

Figure 6:
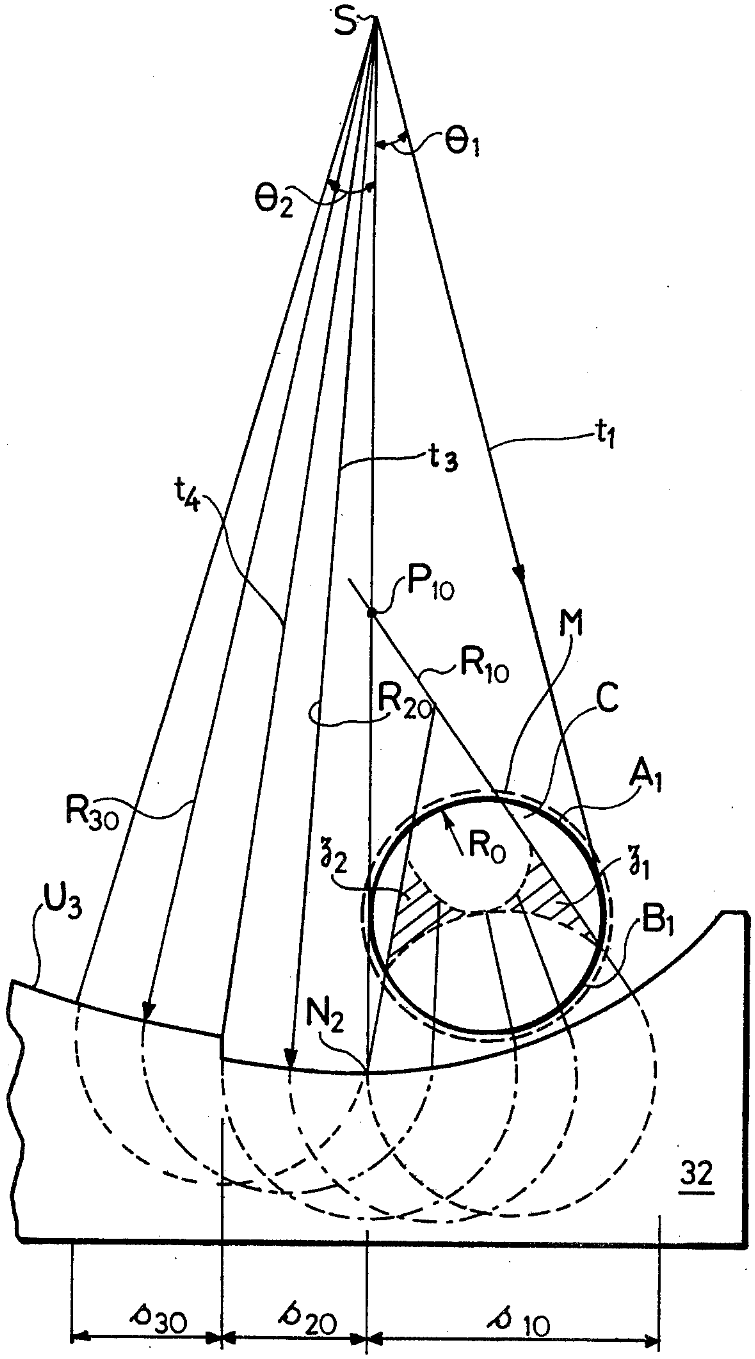

In the example of embodiment shown in FIG. 6, the electromagnet comprises two pole pieces 32 and 33 (only the pole piece 32 is visible in FIG. 6), of which the useful face $U_3$ has three sections $s_{10}$, $s_{20}$ and $s_{30}$. The sections $s_{10}$ and $s_{20}$ are arcs with respective radii $R_{10}$ and $R_{20}$ and a centre of curvature S, the third section $s_{30}$, which is an extension of the sections $s_{20}$, being in the form of an arc of radius $-R_{10}=k_{10}R_{20}$, $k_{10}$ being substantially equal to 0.45, and the centre of curvature $P_{10}$ being situated on the straight line normal to the useful face $U_3$ at the junction $N_2$ of the sections $s_{20}$, $s_{30}$, and forming a tangent to the circle delimiting the section of the target C. Where a beam of particles of which the energy provides for a depth of penetration equal to the radius $R_o$ of the circular cross-section of the passage C, the zones $z_1$ and $z_2$ (which are hatching zones) will each receive a double irradiation dose. In the example shown in FIG. 6, the scanning angles $\theta_1$ and $\theta_2$ of the beam is are substantially equal to 15°.

Figure 7:
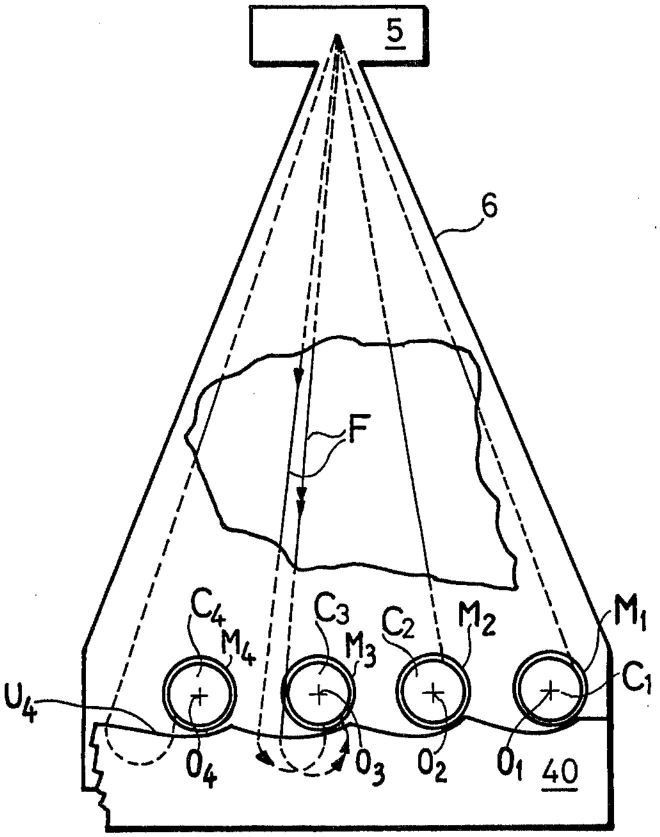

In the foregoing, the projection of the magnetic field beyond the pole pieces of the deflection system was not taken into consideration in determining the profile of the pole pieces. In another example of embodiment (FIG. 7), the irradiation apparatus according to the invention enables a group of n-pipes $C_1$, $C_2$, $C_3$ and $C_4$ (n=4) of circular cross-section to be irradiated. The deflection system for the beam comprises an electromagnet provided with pole pieces 40 and 41 (only the pole piece 40 is visible in FIG. 7), of which the useful faces $U_4$ have a succession of profiles similar to those described and illustrated in FIGS. 4 to 6 and associated with each of the pipes $C_1$ to $C_4$. The scanning chamber 6 may be provided either with a fluid-tight window of great length situated upstream of the passages $C_1$ to $C_4$, or with vacuum-tight windows in the form of cylindrical sleeves $M_1$ to $M_4$ (FIG. 6) made of a material transparent to the accelerated particles (for example titanium of small thickness), the portion of the vacuum chamber 6 which is placed below the pipes $C_1$ to $C_4$ being disposed between the pole pieces 40 and 41 (the pole piece 41 is not visible in FIG. 7) of the electromagnet, the height h of the air gap being kept constant by means of a spacer member as the spacer-member 16 shown in the embodiment represented in FIG. 2.

The embodiments which have been described and illustrated are by no means limitative. In particular, no provision has been made in them for the overlap of the magnetic field, the air gap being assumed to be reduced. If, for certain applications, the air gap has to be large (e>5 cm for example), it is necessary on the one hand to take into account the angle $\alpha$ through which the paths of the beam are deflected in their planes before entering the air gap between the pole pieces, and on the other hand to correct the vertical divergence effect which the beam undergoes in a plane perpendicular to the plane of the paths, this effect being due to the action of the magnetic field projecting beyond the pole pieces.

Figure 8:
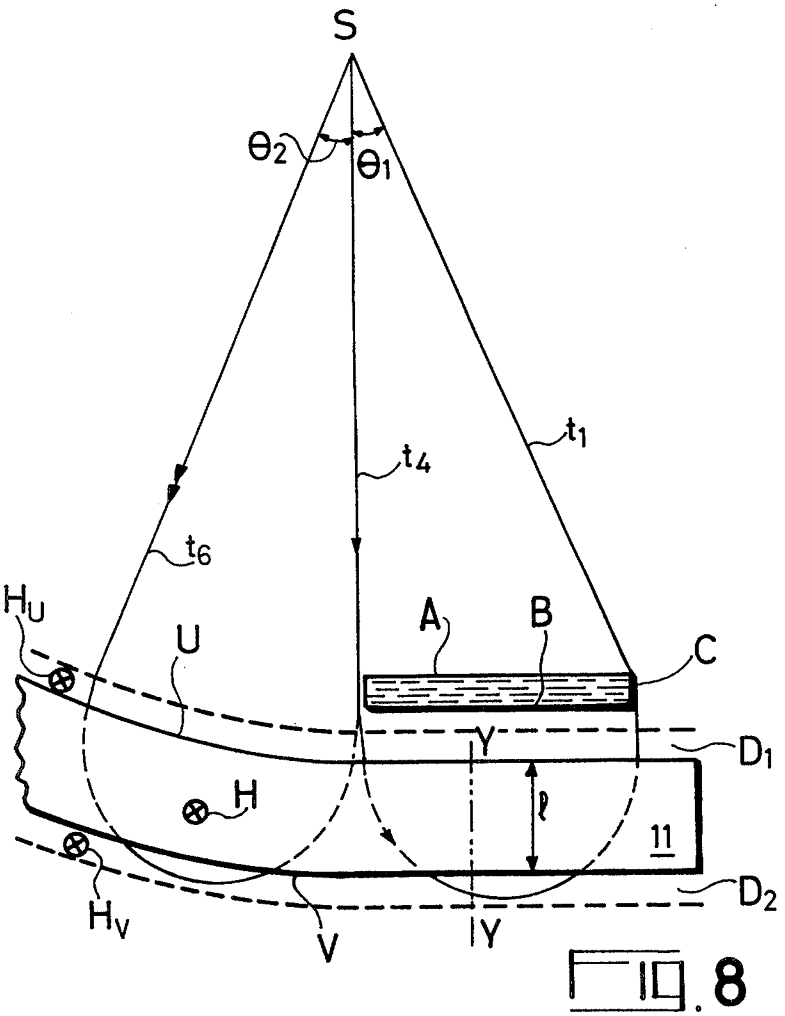
Figure 9:
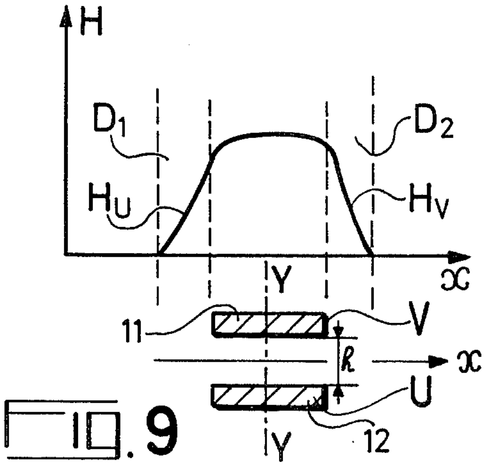
FIGS. 9 to 11 partially show three embodiments of the pole pieces used in the apparatus according to the invention.

FIG. 8 shows one example of embodiment of the irradiation apparatus according to the invention which enables this divergence effect to be corrected. The pole pieces 11, 12 (only the pole piece 11 is visible in FIG. 8) have a useful face U of determined profile (the profile of the useful face U of the pole pieces shown in FIG. 3 for example). The width 1 of the pole pieces 11, 12 is such, and the magnetic field H created in the air gap between these pole pieces 11, 12 has a value such that the paths $t_4$ to $t_6$ of the scanning beam F project beyond the face V opposite the useful surface U of the pole pieces 11, 12 and are subjected to the projecting magnetic field $H_V$ which corrects the divergence effect on the beam F in the vertical plane (FIG. 9). The paths $t_4$ to $t_6$ of the beam then pass back through the air gap between the pole pieces 11, 12 are reflected and leave this air gap by the face U to irradiate the face B of the target C.

The correction effect on the vertical divergence undergone by the beam in the zone $D_1$ is thus obtained if the width 1 of the pole pieces (distance between the faces U and V of these pole pieces) is smaller than the radius of curvature r of the paths in the air gap between these pole pieces.

By way of illustration, if the air gap has a height h of 30 cm and if the magnetic field H within the pole pieces 11, 12 is approximately 700 gauss, which corresponds to a mean radius of curvature r of the paths of the order of 50 cm for accelerated electrons having an energy of 10 Mev, the width 1 of the pole pieces is approximately 30 cm. Under these conditions, the beam penetrates a few centimeters into the zone $D_2$ and the distance between the entry and exit points of the paths (face U) is approximately 110 cm.

Figure 10:
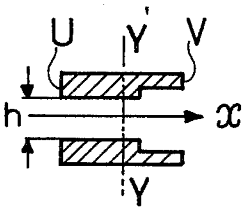
Figure 11:
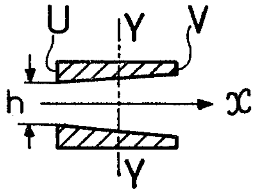

The examples of embodiment described and illustrated are in no way limitative. In particular, the correction of the vertical divergence undergone by the beam in the zone $D_1$ may be obtained by an air gap of which the height h varies in the direction from the face U towards the face V, introducing a variation of the magnetic field in the pole pieces 11, 12. The height h of the air gap may increase progressively in the direction from the face U to the face V or may increase in successive stages, as shown respectively in FIGS. 11 and 10.

What we claim is:

1. A two-face irradiation apparatus for irradiating, by means of a charged particle beam, a target having at least two opposite faces A and B, said apparatus comprising a charged particle accelerator, a microwave generator supplying a microwave signal, means for injecting this microwave signal into said accelerating structure, means for obtaining a scanning beam of a predetermined amplitude corresponding to a scanning angle $\theta$ from said beam of accelerated particles moving in a vacuum-tight scanning chamber, said target being disposed over part of the path followed by the scanning beam corresponding to a scanning angle $\theta_1$ in such a way that the scanning beam of angle $\theta_1$ impinges on said face A of said target; a magnetic deflection system provided with two pole pieces delimiting an air gap disposed downstream of said target, these pole pieces, which are arranged parallel to the scanning plane, having a length at least equal to said amplitude of said scanning beam on a level with said pole pieces, said scanning chamber being provided with at least one opening for positioning said target on the portion of said scanning beam corresponding to a scanning angle $\theta_1$, said opening being provided with at least one vacuum-tight window which is transparent to said scanning beam, the portion of the beam corresponding to a scanning angle $\theta_2=\theta-\theta_1$ and which is not intercepted by said target, entering said air gap of the pole pieces and being reflected to impinge on said opposite face B, said pole pieces having a face, so-called useful face, facing said opposite face B, said useful face comprising several sections having different curvatures for obtaining a reflected beam substantially perpendicular to said opposite face B.

2. A two-face irradiation apparatus as claimed in claim 1, wherein said target has a rectangular cross-section in the scanning plane, said useful face of said pole pieces having two sections $s_{11}$, $s_{12}$ differing in their curvature, one of said sections, which is situated below said target, being a rectilinear section and the other section having a radius of curvature R substantially equal to the distance separating the origin S of the scanning beam from the rectilinear section of said useful face of said pole pieces.

3. A two-face irradiation apparatus as claimed in claim 1, wherein the target has a circular cross-section of radius $R_o$ in the scanning beam plane, said useful face of the pole pieces, which is concave in shape, having at least a section of radius of curvature $R_1$ equal to $k_1r$, r being the radius of curvature of the particle paths in the pole pieces and $k_1$ being a constant from 2 to 4, the centre of curvature being substantially situated at the origin S of said scanning beam; said vacuum-tight window being a cylindrical sleeve of diameter $D>2\ R_o$, said sleeve which is sealed at the two walls opposite the scanning chamber, having its axis perpendicular to the scanning beam plane, said window which is transparent to said particle beam being concentric with the circular cross-section of said target.

4. A two-face irradiation apparatus as claimed in claim 1, wherein said target has a circular cross-section of radius $R_o$ in the scanning beam plane, said useful face of the pole pieces having a profile with two concave sections $s_1$, $s_2$ differing in their curvature, one of said sections situated below said target having a radius of curvature $R_2$ equal to $k_2R_1$, $R_1$ being the radius of curvature of the other section and $k_2$ being a number of from 0.4 to 0.8, the centre of curvature of said other section having a radius of curvature $R_1=k_1r$, $k_1$ being a constant from 2 to 4 and r of the radius of curvature of the particle paths in the pole pieces, said centre of curvature being situated at the origin S of the scanning beam and the centre of curvature of the section located below said target being situated substantially on a straight line which forms a tangent to said target and which is normal to the useful face at the junction of said two sections.

5. A two-face irradiation apparatus as claimed in claim 1, wherein said target has a circular cross-section of radius $R_o$ in the plane of said scanning beam, said useful face of the pole pieces having a profile with three sections differing in their curvature, the two sections which are the farthest of said target and which correspond to a scanning angle substantially equal to $\theta/2$, having the same centre of curvature coinciding with the origin S of the scanning beam and respectively having radii and $R_{30}$ such that $R_{30}=qR_{20}$, q being a number of 0.8 to 1, and the other section corresponding to a scanning angle $\theta/2$ having a radius of curvature $R_{10}=k_2R_{20}$, $0.4<k_2<0.8$, and a centre of curvature situated on the normal to the useful face at the junction of said two sections, said vacuum-tight window being a cylindrical sleeve M of diameter $D>2_o$, of which the axis is perpendicular to the scanning beam plane and which is made of a material transparent to the particle beam.

6. A two-face irradiation apparatus as claimed in claim 1, wherein said target to be irradiated is formed by n-pipes $C_1, C_2 \ldots C_n$ having circular cross-sections in the scanning beam plane and having the same diameter, their centres of curvature $O_1, O_2 \ldots O_n$ being situated on a straight line of said scanning beam plane, said straight line being perpendicular to the mean trajectory of the scanning beam, and said useful face of the pole pieces comprising n identical portions of predetermined shape, each of said portions comprising at least a concave section.

7. A two-face irradiaton apparatus as claimed in claim 6, wherein said scanning chamber is provided with a vacuum-tight windows formed by n cylindrical sleeves $M_1, M_2 \ldots M_n$ respectively concentric to said pipes $C_1, C_2 \ldots C_n$ and having their axes perpendicular to said scanning plane.

8. A two-face irradiation apparatus as claimed in claim 1 wherein the pole pieces which delimit an air gap of height h have a width comprised between the useful face and the opposite face which is smaller than the means radius of curvature r of the trajectories, said width being substantially equal to said height h of said air gap.

9. A two-face irradiation apparatus as claimed in claim 1 wherein said pole pieces delimit an air gap having a height h increasing from the useful face towards the opposite face.

10. A two-face irradiation apparatus as claimed in claim 9, wherein said height h of said gir gap increases.

11. A two-face irradiation apparatus as claimed in claim 9, wherein said height h of said air gap increases by successive stages.

* * * * *